United States Patent
Li

(10) Patent No.: US 11,114,431 B2
(45) Date of Patent: Sep. 7, 2021

(54) ELECTROSTATIC DISCHARGE PROTECTION DEVICE

(71) Applicants: Semiconductor Manufacturing International (Beijing) Corporation, Beijing (CN); Semiconductor Manufacturing International (Shanghai) Corporation, Shanghai (CN)

(72) Inventor: Yong Li, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 43 days.

(21) Appl. No.: 16/674,098

(22) Filed: Nov. 5, 2019

(65) Prior Publication Data

US 2020/0075578 A1 Mar. 5, 2020

Related U.S. Application Data

(62) Division of application No. 15/275,030, filed on Sep. 23, 2016, now Pat. No. 10,504,887.

(30) Foreign Application Priority Data

Oct. 10, 2015 (CN) .......................... 201510654344.9

(51) Int. Cl.
*H01L 27/02* (2006.01)
*H01L 29/78* (2006.01)
(Continued)

(52) U.S. Cl.
CPC .... *H01L 27/0266* (2013.01); *H01L 21/26513* (2013.01); *H01L 21/823431* (2013.01);
(Continued)

(58) Field of Classification Search
CPC .......... H01L 29/0847; H01L 29/66795; H01L 29/66803; H01L 29/7851; H01L 29/7853;
(Continued)

(56) References Cited

U.S. PATENT DOCUMENTS

2007/0181946 A1 8/2007 Mathew et al.
2013/0126972 A1 5/2013 Wang
(Continued)

FOREIGN PATENT DOCUMENTS

EP 2889906 A1 7/2015

*Primary Examiner* — Sue A Purvis
*Assistant Examiner* — Scott Stowe
(74) *Attorney, Agent, or Firm* — Anova Law Group, PLLC

(57) ABSTRACT

Electrostatic discharge (ESD) protection device is provided. An ESD device includes a substrate having an input region; a plurality of fins on the substrate in the input region; a well region, doped with first-type ions, in the plurality of fins and in the substrate; an epitaxial layer on each fin in the input region; a drain region, doped with second-type ions, in a top portion of each fin and in the epitaxial layer; an extended drain region, doped with the second-type ions, in a bottom portion of each fin to connect to the drain region and in a portion of the substrate, in the input region; and a counter-doped region, doped with the first-type ions, in a portion of the substrate between two adjacent fins to insulate adjacent extended drain regions.

15 Claims, 7 Drawing Sheets

(51) Int. Cl.
 *H01L 21/8234* (2006.01)
 *H01L 29/66* (2006.01)
 *H01L 21/265* (2006.01)
 *H01L 27/088* (2006.01)
 *H01L 29/08* (2006.01)

(52) U.S. Cl.
 CPC ...... *H01L 27/0248* (2013.01); *H01L 27/0886* (2013.01); *H01L 29/0847* (2013.01); *H01L 29/66795* (2013.01); *H01L 29/66803* (2013.01); *H01L 29/7851* (2013.01); *H01L 29/7853* (2013.01)

(58) Field of Classification Search
 CPC ............. H01L 27/0266; H01L 27/0248; H01L 27/0886; H01L 21/26513; H01L 21/823431
 See application file for complete search history.

(56) References Cited

U.S. PATENT DOCUMENTS

| | | |
|---|---|---|
| 2014/0306296 A1 | 10/2014 | Jeon et al. |
| 2015/0091086 A1 | 4/2015 | Lu et al. |
| 2015/0155206 A1 | 6/2015 | Erickson et al. |
| 2015/0311342 A1 | 10/2015 | Lin et al. |
| 2016/0293734 A1 | 10/2016 | Tang et al. |

ELECTROSTATIC DISCHARGE PROTECTION DEVICE

CROSS-REFERENCES TO RELATED APPLICATIONS

This application is a divisional of U.S. patent application Ser. No. 15/275,030, filed on Sep. 23, 2016, which claims the priority of Chinese Patent Application No. 201510654344.9 filed on Oct. 10, 2015, the entire content of all of which is incorporated herein by reference.

FIELD OF THE DISCLOSURE

The present disclosure generally relates to the field of semiconductor technology and more particularly, relates to an electrostatic discharge protection device.

BACKGROUND

With increasingly widespread application of semiconductor chips, more factors can cause electrostatic damages to semiconductor chips. In conventional chip design, electrostatic discharge (ESD) protection circuit is often used to protect circuits and to reduce chip damages. The design and application of conventional electrostatic protection circuits often include gate grounded NMOS (GGNMOS) protection circuits, shallow trench isolation diode (STI diode) protection circuits, gated diode protection circuits, laterally diffused MOS (LDMOS) protection circuits, bipolar junction transistor (BJT) protection circuits, etc.

As the development of semiconductor technology, the dimensions of semiconductor devices continue to decrease, and device density continues to increase. Conventional ESD protection circuits can no long meet the requirements of semiconductor technology. Fin field-effect-transistors (FinFETs) are desired in ESD protection circuits.

However, as the dimensions of the semiconductor devices continue to decrease, even though FinFETs are applied in ESD protection circuits, these ESD protection circuits still have unstable performances.

The disclosed ESD protection device and the fabrication method to form the ESD protection device are directed to solve one or more problems set forth above and other problems.

BRIEF SUMMARY OF THE DISCLOSURE

One aspect of the present disclosure provides a method for forming an electrostatic discharge (ESD) protection device, including: providing a substrate including an input region; forming a plurality of fins on the substrate in the input region; forming a well region, doped with first-type ions, in the plurality of fins and in the substrate; and forming an epitaxial layer on each fin in the input region. The method further includes: forming a drain region, doped with second-type ions, in a top portion of each fin and in the epitaxial layer; forming an extended drain region, doped with the second-type ions, in a bottom portion of each fin to connect to the drain region and in a portion of the substrate, in the input region; and forming a counter-doped region, doped with the first-type ions, in a portion of the substrate between two adjacent fins to insulate adjacent extended drain regions Another aspect of the present disclosure provides an electrostatic discharge (ESD) protection device, including: a substrate having an input region; a plurality of fins on the substrate in the input region; a well region, doped with first-type ions, in the plurality of fins and in the substrate; and an epitaxial layer on each fin in the input region. The ESD protection device also includes: a drain region, doped with second-type ions, in a top portion of each fin and in the epitaxial layer; an extended drain region, doped with the second-type ions, in a bottom portion of each fin to connect to the drain region and in a portion of the substrate, in the input region; and a counter-doped region, doped with the first-type ions, in a portion of the substrate between two adjacent fins to insulate adjacent extended drain regions.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

Figure 1:
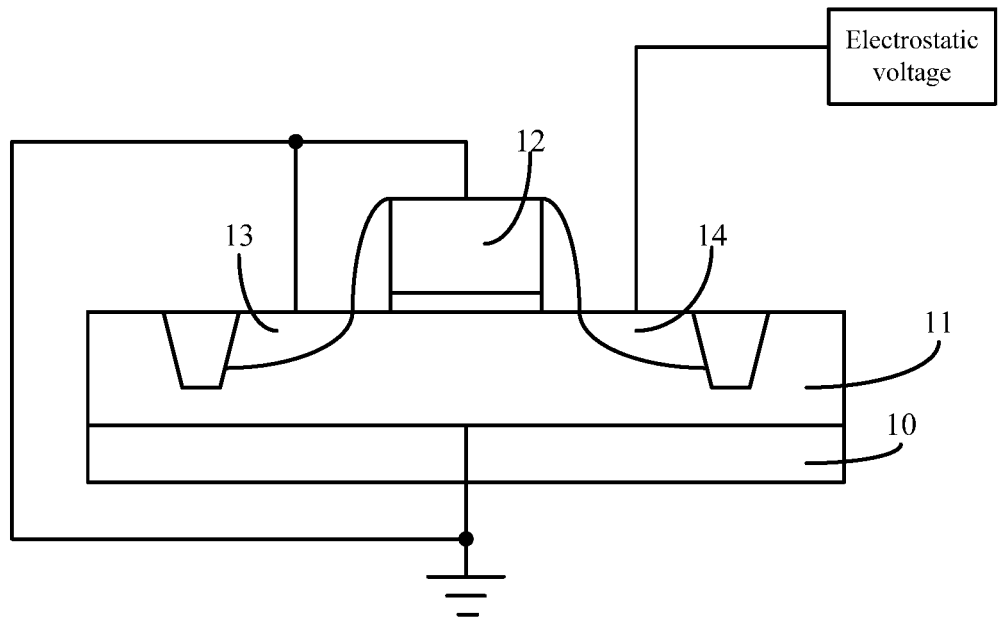
FIG. 1 illustrates a cross-sectional view of a conventional GGNMOS protection circuit.

FIG. 1 illustrates a cross-sectional view of a conventional GGNMOS protection circuit. The GGNMOS protection circuit may include a substrate 10, a P-type well or P well 11 in the substrate 10, a gate structure 12 on the P well, and an N-type source electrode 13 and an N-type drain electrode 14 in the P well 11 on two sides of the gate structure 12. The N-type source electrode 13, the P well 11, and the N-type drain electrode 14 form a parasitic NPN transistor. The source electrode 13 is the emitter of the parasitic NPN transistor, the drain electrode 14 is the collector of the parasitic NPN transistor, and the P well 11 is the base of the parasitic NPN transistor. The source electrode 13, the P well 11, and the gate electrode of the gate structure 12 are grounded. An electrostatic voltage is inputted into the drain electrode 14.

Figure 2:
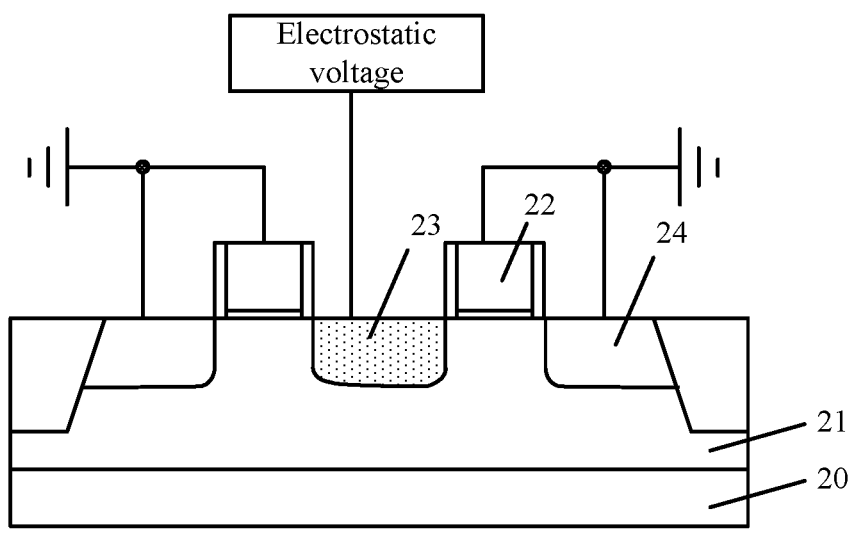
FIG. 2 illustrates a cross-sectional view of a conventional gated diode protection circuit.

FIG. 2 illustrates a cross-sectional view of a conventional gated diode protection circuit. The gated diode protection circuit includes a substrate 20, a P well 21 in the substrate 20, a plurality of separated gate electrodes 22 on the P well 21, and an N-type region 23 and a P-type region 24 in the P well 21 between adjacent gate electrodes 22. Adjacent P-type region 24 and N-type region 23 are located on the two sides of a same gate electrode 22. The P-type region 24 and the gate electrode 22 are grounded. An electrostatic voltage is inputted to the N-type region 23.

Figure 3:
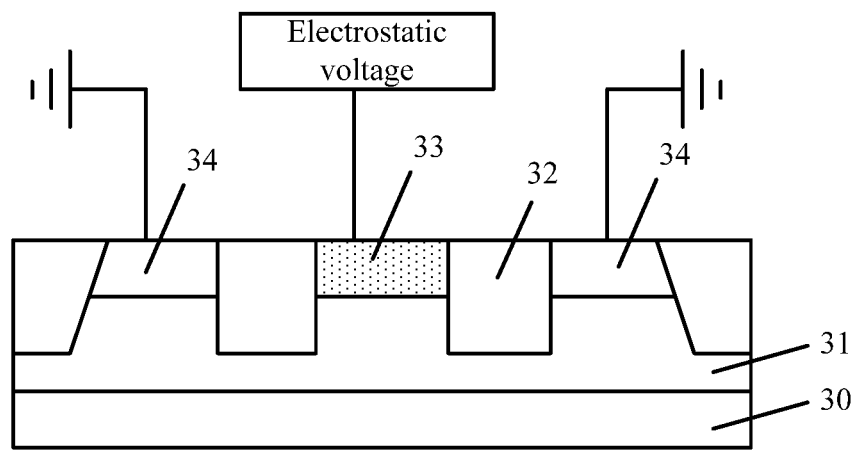
FIG. 3 illustrates a cross-sectional view of a conventional STI diode protection circuit.

FIG. 3 illustrates a cross-sectional view of a conventional STI diode protection circuit. The conventional STI diode protection circuit includes a substrate 30, a P well 31 in the substrate 30, a plurality of separated STI structures 32 in the P well 31, and N-type regions 33 and P-type regions 34 in the P well 31 between adjacent STI structures 32. Adjacent P-type region 34 and N-type region 33 are located at the two sides of a same STI structure. The P-type region 34 and the STI structures 32 are grounded. An electrostatic voltage is inputted into the P-type region 34.

Figure 4:
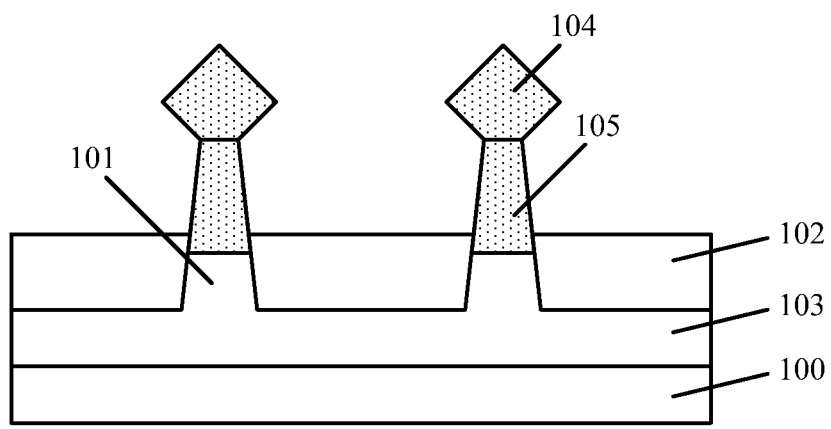
FIG. 4 illustrates a cross-sectional view of an exemplary ESD protection circuit consistent with the disclosed embodiments of the present disclosure.

FIG. 4 illustrates a cross-sectional view of an exemplary ESD protection circuit. The ESD protection circuit may include a substrate 100, fins 101 on the substrate 100, and an insulating layer 102 on the substrate 100. The insulating layer 102 may cover a portion of the sidewall of a fin 101. A P well 103 may be formed in the fins 101 and in a portion of the substrate 100. An epitaxial layer or epi-layer 104 may be formed on the top surface of a fin 101. An N-type doped region 105 (shown as the dotted region in FIG. 4) may be formed in an epi-layer 104 and in the portion of a fin 101 that is in contact with the epi-layer 104. The N-type doped regions 105 may be formed in the P well 103.

In one embodiment, the ESD protection circuit may include the fins 101. The P well 103 and an N-type doped region 105 may form a PN junction. An electrostatic voltage may be inputted through the N-type doped regions 105. When the electrostatic voltage reversely breaks down the PN junctions, electrostatic charges may flow into the P well 103.

When the ESD protection circuit is a GGNMOS protection circuit, the N-type doped region 105 may function the same or similar with the drain electrode 14 shown in FIG. 1. When the ESD protection circuit is a gated diode protection circuit, the N-type doped region 105 may function the same or similar with the N-type region 23 shown in FIG. 2. When the ESD protection circuit is an STI diode protection circuit, the N-type doped region 105 may function the same or similar with the N-type region 33 shown in FIG. 3.

However, as the dimensions of semiconductor devices decrease and device density increases, the width of a fin 101 may decrease. An N-type doped region 105 may contact the P well 103 in a fin 101. That is, the width of a fin 101 may determine the contact area between an N-type doped region 105 and the P well 103. Because the width of a fin 101 is considerably small, the contact area between an N-type doped region 105 and the P well 103 may be considerably small, the breakdown current in a PN junction may be undesirably small. As a result, an undesirably large amount of electrostatic charges may accumulate in the N-type doped regions. Thus, the ESD protection circuit not only has inferior performance in discharging electrostatic charges, the N-type doped regions 105 in the fins 101 may also be susceptible to self-heating phenomenon. The operation efficiency of the ESD protection circuit may decrease and the service time of the ESD protection circuit may decrease.

To solve the above-mentioned problem, the present disclosure provides an ESD protection device and the method for forming the ESD protection device. The method for forming the ESD protection device may include a plurality of steps. First, a substrate may be provided. The substrate may include grounding regions and input regions. Fins may be formed on the grounding region. An insulating layer may be formed on the substrate. The insulating layer may cover a portion of the sidewall of a fin. The top surface of the insulating layer may be lower than the top surface of a fin. Further, well regions may be formed in the substrate and the fins. First-type ions may be doped into the well regions. Further, an epi-layer may be formed on the top surface of a fin in the input region. A drain region may be formed in the portion of a fin, formed in the input region, that is close to the top surface of the fin and in the epi-layer on the fin. Second-type ions may be doped into the drain regions. A first ion implantation process may be performed to form extended drain regions in the fins and the portion of the substrate in the input region. The extended drain regions may be connected to the drain regions and may be doped with second-type ions. A second ion implantation process may be performed to form counter-doped regions in the portion of the substrate in the input region. A counter-doped region may be located between adjacent fins and insulate adjacent extended drain regions. First-type ions may be doped into the counter-doped regions.

By performing the first ion implantation, the extended drain regions may be formed. The extended drain regions may extend from the fins into the substrate such that the bottom of an extended drain region may be below the top surface of the substrate. The counter-doped regions, formed through the second ion implantation process, may be located in the substrate between adjacent fins. A counter-doped region may insulate adjacent extended drain regions, which extend from adjacent fins to the substrate. The counter-doped regions and the well regions may be doped with first-type ions. The drain regions and the extended drain regions may be doped with second-type ions. Thus, an extended drain region may form a PN junction with a well and a counter-doped region, respectively. For the some of the extended drain regions in the substrate, the bottoms of which may contact the well regions and the sidewalls of which may contact counter-doped regions, the junction area of a PN junction formed by an extended drain region and the well/counter-doped region may be sufficiently large, so that the breakdown current of the PN junction may be effectively increased/improved. Little or no electric charges may accumulate in the drain regions. The disclosed ESD structure may more efficiently discharge electrostatic charges, and may prevent heating problems in the fins caused by the accumulation of electric charges. The disclosed ESD structure may prevent semiconductor devices from being damaged and the service time of the semiconductor devices may be improved.

Embodiments of the present disclosure are now illustrated in detail in connection with the drawings.

Figure 12:
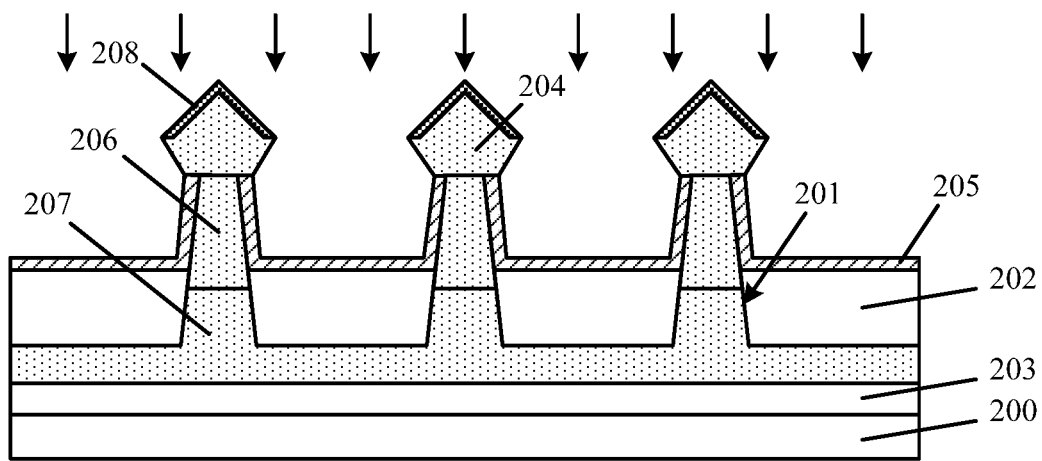
Figure 13:
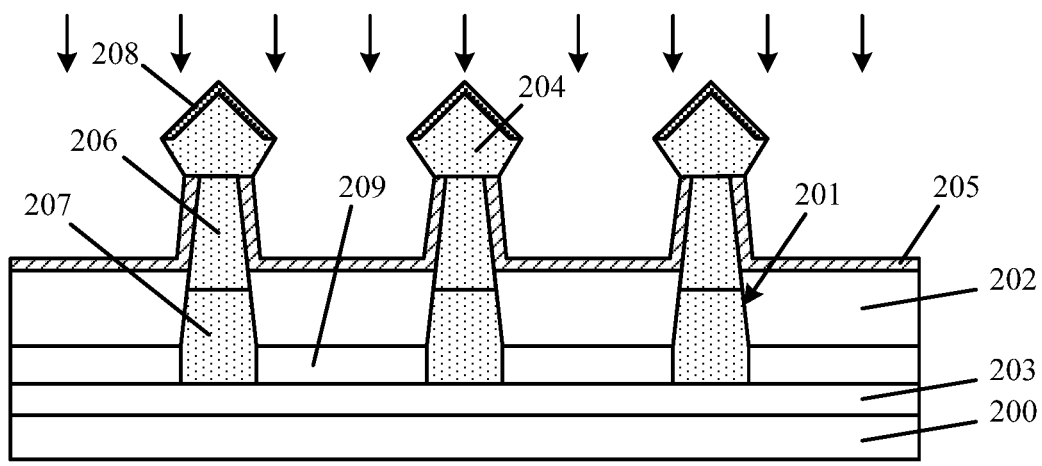
Figure 14:
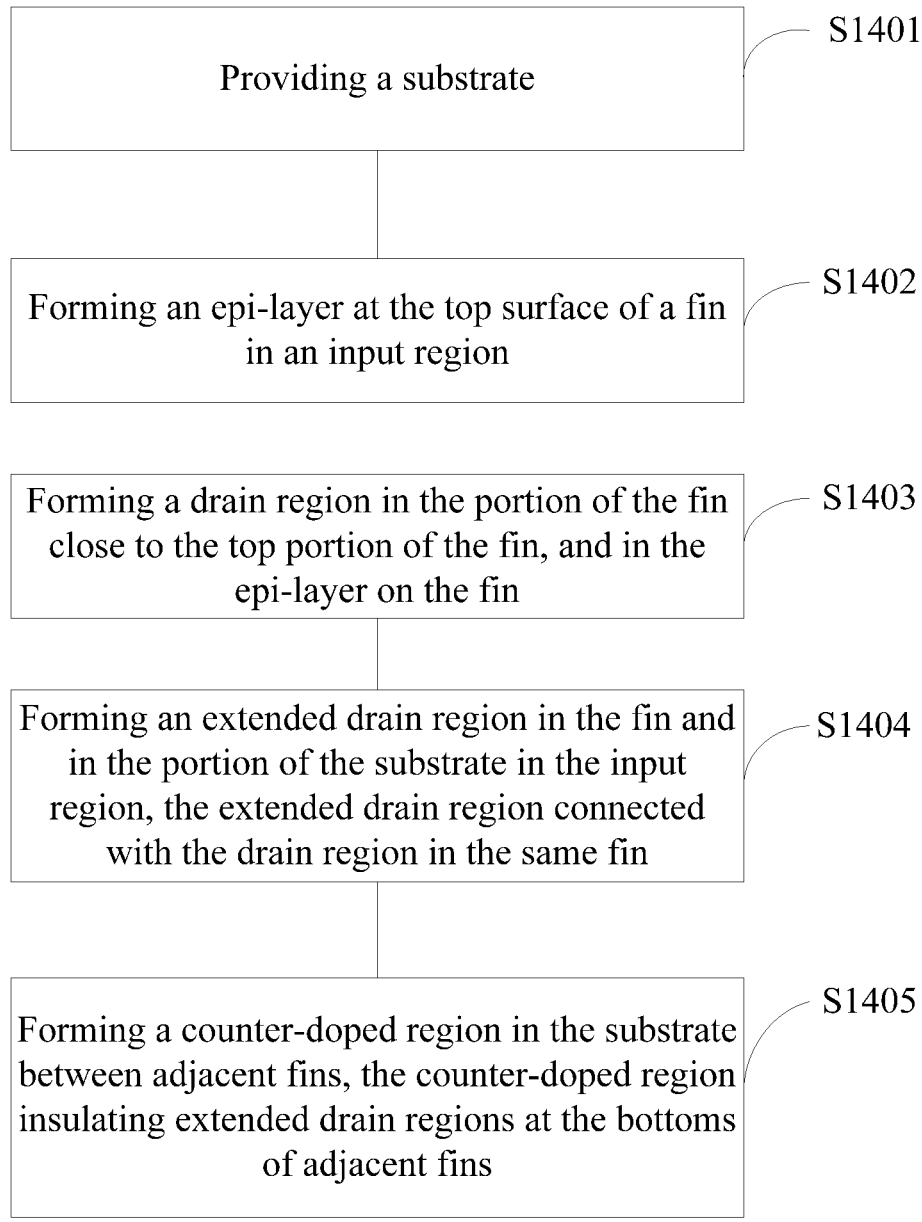
FIG. 14 illustrates an exemplary process flow to form an ESD protection device consistent with various disclosed embodiments of the present disclosure.

FIGS. 5-13 each illustrates a cross-sectional view of an ESD protection device at certain stages during its formation consistent with various disclosed embodiments of the present disclosure. FIG. 14 illustrates an exemplary fabrication process to form the disclosed ESD protection device.

Figure 5:
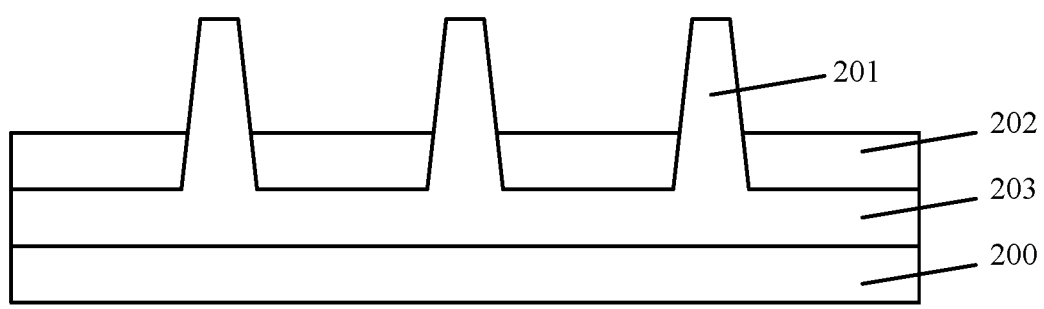
FIGS. 5-13 each illustrates a cross-sectional view of an ESD protection circuit at certain stages during its formation consistent with various disclosed embodiments of the present disclosure.

As shown in FIG. 14, at the beginning of the process, a substrate is provided. FIG. 5 illustrates a corresponding structure (S1401).

As shown in FIG. 5, a substrate 200 may be provided. The substrate 200 may include an input region (shown as element 210 in FIGS. 6-8). Fins 201 may be formed on the top surface of the substrate 200 in the input region 210. An insulating layer 202 may be formed on the top surface of the substrate 200. The insulating layer 202 may cover a portion of the sidewall of each fin 201. The top surface of the insulating layer 202 may be lower than the top surfaces of the fins 201. A well region 203 may be formed in the fins 201 and in the substrate 200. The well region 203 may be doped with first-type ions.

Subsequently, drains regions formed in the input region 210 may be connected to an electrostatic voltage. In one embodiment, the substrate 200 may also include grounding regions. Fins 201 may be formed on the surface of the substrate 200 in the grounding region. Source regions may subsequently be formed in the grounding region to discharge the electrostatic charges flown into the source regions.

The number of fins 201 in the input region 210 may be equal to or greater than 1. The number of fins 201 in a grounding region may be equal to or greater than 1. In one embodiment, in an input region 210, a plurality of fins 201 may be arranged in parallel; and in a grounding region, a plurality of fins 201 may be arranged in parallel.

In one embodiment, the process to form the fins 201 on the substrate 200 may include the following fabrication steps. First, a semiconductor substrate may be provided. The semiconductor substrate may be etched to form a plurality of trenches in the semiconductor substrate. The portion of the semiconductor substrate between adjacent trenches may form a fin 201. The fins 201 and the portions of the semiconductor substrate under the bottoms of the trenches may form the substrate 200. The semiconductor substrate may be made of single crystalline silicon, single crystalline germanium, silicon germanium, and/or silicon carbide. In one embodiment, the semiconductor substrate may be made of single crystalline silicon.

In another embodiment, the process to form the fins 201 may include the following fabrication steps. An epitaxial process may be performed to form a fin layer on the substrate 200. The fin layer may be etched to form a plurality of trenches. The portion of the fin layer between adjacent trenches may form a fin 201. The substrate 200 may be made of silicon, silicon germanium, silicon carbide, silicon on insulator, germanium on insulator, glass, and/or III-V compound, such as gallium nitride and/or gallium arsenide. The fin layer may be made of a suitable material such as silicon, germanium, silicon carbide, and/or silicon germanium.

The insulating layer 202 may insulate adjacent fins 201. The insulating layer 202 may be made of one or more of silicon oxide, silicon nitride, a low-K dielectric material (i.e., with dielectric constant equal to or greater than 2.5 and less than 3.9), and an ultra-low-K dielectric material (i.e., with dielectric constant less than 2.5). In one embodiment, the insulating layer 202 may be made of silicon oxide. The thickness of the insulating layer 202 may be in the range of about 50 nm to about 80 nm, e.g., about 60 nm.

The process to form the insulating layer 202 may include the following fabrication steps. First, an insulating film may be formed on the substrate 200 and the fins 201. The insulating film may be planarized to expose the top surfaces of the fins 201. After planarizing the insulating film, the insulating film may be etched back to expose a portion of the sidewall of a fin 201 to form the insulating layer 202.

In one embodiment, the well region 203 may be formed before the formation of the substrate 200 and the fins 210. Also, the well region 203 may be formed in the portion of the substrate 200 that is in the input region 210, and in the fins 201, in the grounding region 220. The well region 203 may be formed through ion implantation. The first-type ions in the well region 203 may be P-type ions. In one embodiment, the ions doped into the well region 203 may be boron ions.

Figure 6:
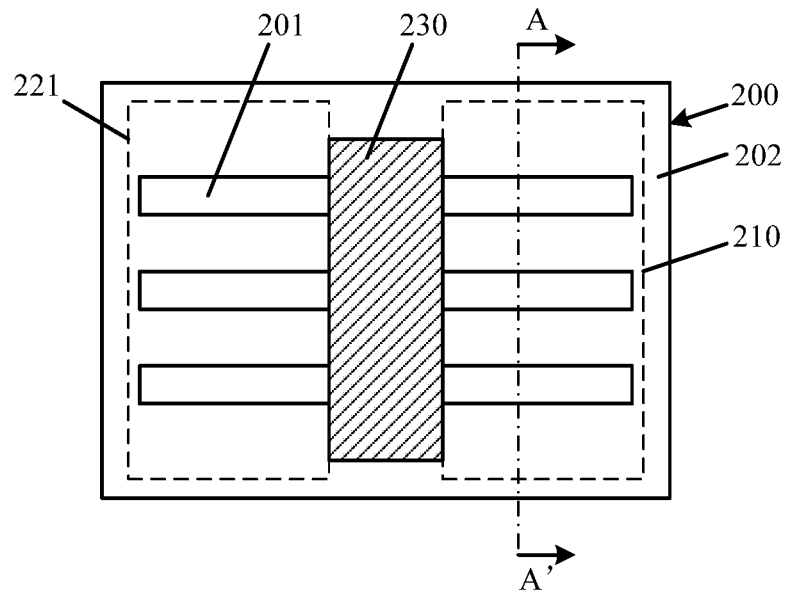

In one embodiment, FIG. 5 is the cross-section view of the structure shown in FIG. 6 along the AA' direction. A fin 201 may have a first portion in the input region 210 and a second portion in a grounding region 221. A gate structure 230 may be formed on the fin portions between the input region 210 and the grounding region 221. The gate structure 230 may cross a plurality of fins 201 along a direction the fins 201 are aligned. The gate structure 230 may be formed on a portion of the sidewall and on the top surface of fins 201.

The gate structure 230 may ground the disclosed ESD protection device. The gate structure 230 may include a gate dielectric layer covering portions of the insulating layer 202. The gate dielectric layer may also cover a portion of the sidewall and a portion of the top surface of a fin 201. The gate structure 230 may also include a gate electrode layer on the gate dielectric layer. The gate structure may further include sidewalls on side surfaces of the gate electrode layer and the gate dielectric layer. The gate structure 230 may be a dummy gate structure. The gate electrode layer may be made of polysilicon. The gate dielectric layer may be made of silicon oxide. The sidewalls may be made of one or more of silicon oxide, silicon nitride, and silicon oxynitride. After the subsequent second ion implantation process, the gate electrode layer and the gate dielectric layer may be removed, and high-K dielectric layer and metal gate electrodes may be formed.

After forming the gate structure 230, the process to form the ESD protection device may further include forming lightly-doped regions in the fins 201 on both sides of the gate structure 230. The lightly-doped regions may be doped with second-type ions. In one embodiment, the lightly-doped regions may be doped with N-type ions. The N-type ions may be phosphorus ions and/or arsenic ions.

Figure 7:
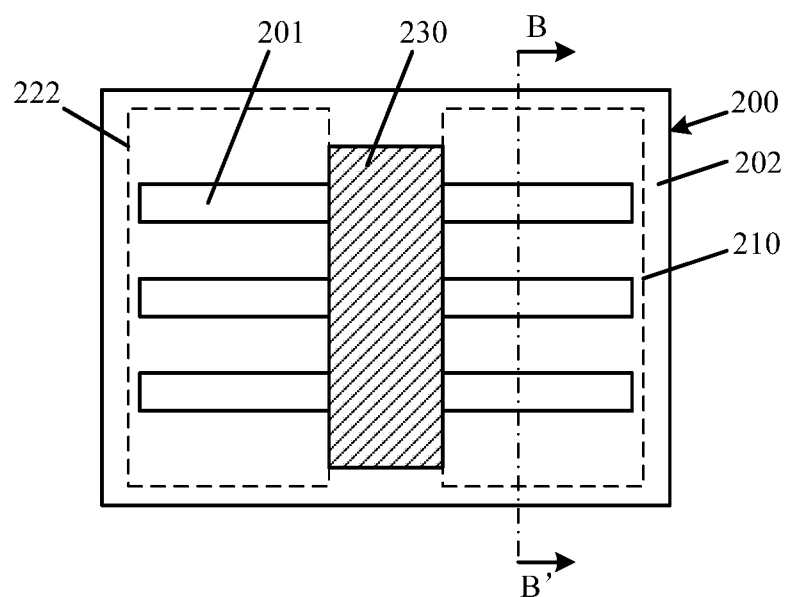

Subsequently, source regions may be formed in the fins 201 in the grounding regions 221, and the source regions may be doped with first-type ions. In one embodiment, the ESD protection device to be formed may have a gated diode protection circuit structure. Further, when the source regions are doped with the first-type ions, the grounding regions 221 may be located on both sides of an input region In another embodiment, as shown in FIGS. 5 and 7, FIG. 5 is a cross-sectional view of the ESD structure shown in FIG. 7 along the BB' direction. A fin 201 may include a first portion in the input region 210 and a second portion in the grounding region 222. A gate structure 230 may be formed on the fin portion between the input region 210 and grounding region 221. The gate structure 230 may cross a plurality of fins 201 along a direction the fins 201 are aligned. The gate structure 230 may be formed on a portion of the sidewall and on the top surface of fins 201.

The gate structure 230 may ground the disclosed ESD protection device. The gate structure 230 may include a gate dielectric layer covering portions of the insulating layer 202. The gate dielectric layer may also cover a portion of the sidewall and a portion of the top surface of a fin 201. The gate structure 230 may also include a gate electrode layer on the gate dielectric layer. The gate structure may further include sidewalls on the side surfaces of the gate electrode layer and on the gate dielectric layer. The gate electrode layer may be made of polysilicon. The gate dielectric layer may be made of silicon oxide. The sidewalls may be made of one or more of silicon oxide, silicon nitride, and silicon oxynitride.

Subsequently, source regions may be formed in the fins 201 in the grounding regions 222. The source regions may be doped with second-type ions. In one embodiment, the ESD protection device to be formed may have a GGNMOS protection circuit structure.

Figure 8:
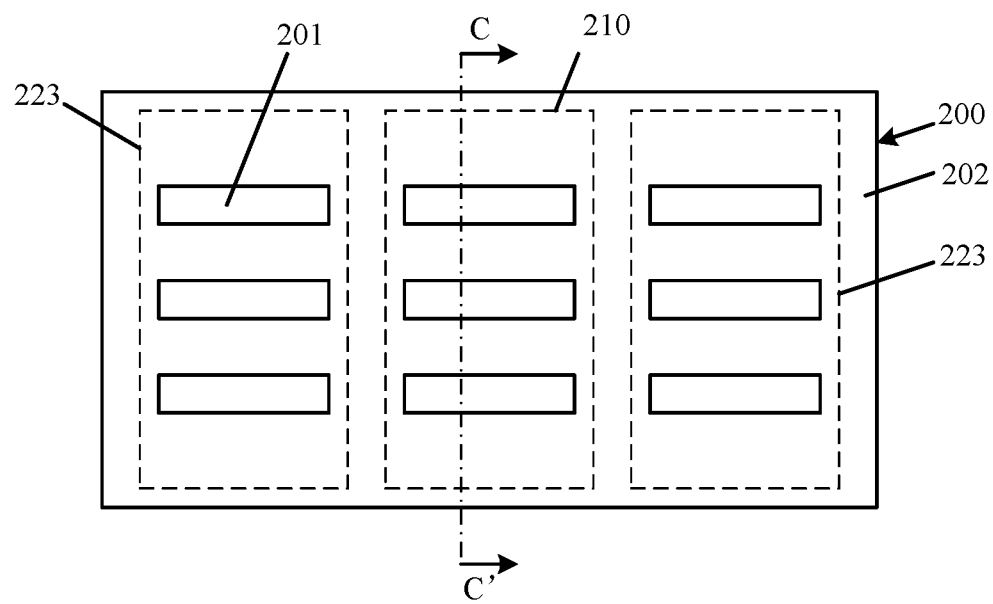

In another embodiment, as shown in FIGS. 5 and 8, FIG. 5 is a cross-sectional view of the structure shown in FIG. 8 along the CC' direction. The fins 201 in the input regions 210 may be separated from the fins 201 in the grounding regions 223. Subsequently, source regions may be formed in the fins 201 in the grounding regions 223. The source regions may be doped with first-type ions. The grounding regions 223 may be located on the both sides of an input region 210. In one embodiment, the ESD protection device to be formed may have an STI diode circuit structure.

Figure 9:
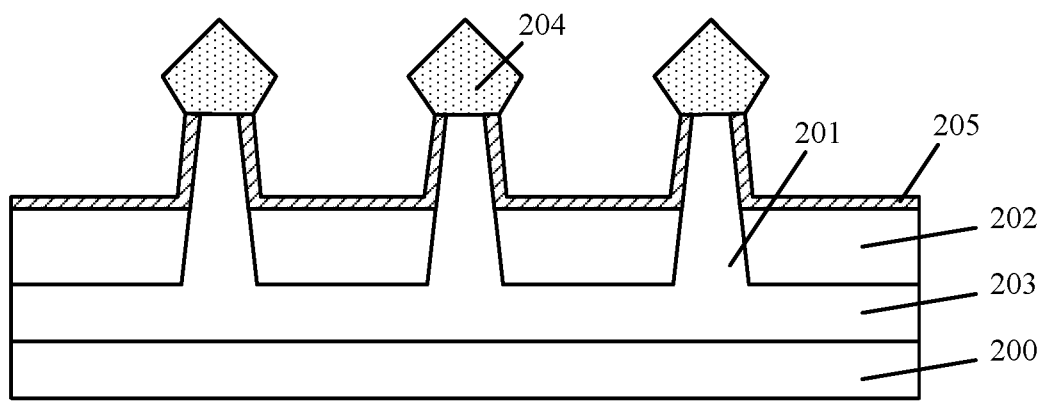

Referring to FIG. 14, after the substrate is provided, an epi-layer is formed on the top surface of a fin in an input region (S1402). FIG. 9 illustrates a corresponding structure.

As shown in FIG. 9, an epi-layer 204 may be formed on the top surface of each fin 201 in an input region 210.

An epi-layer 204 may be configured to form a drain region. Further, because the surface area of an epi-layer 204 is greater than the surface area of the top portion of a fin 201, in the subsequent fabrication step to form conductive plug structures, formed on the epi-layers 204 for electrically connecting the source regions, the contact area between a conductive plug structure and the corresponding drain region may be increased. Accordingly, contact resistance may be reduced.

The process to form the epi-layers 204 may include the following fabrication steps. First, a barrier layer 205 may be formed on the insulating layer 202 and on the sidewall of a fin 201. The barrier layer 205 may expose a portion of the top surface of a fin 201 in an input region 210. The barrier layer 205 may be used as the mask for a selective epitaxial deposition process, to form an epi-layer 204 on a fin 201.

The distance between the top or topmost portion of an epi-layer 204 and the surface of the barrier layer 205 that covers the insulating layer 202 may be in the range of about 30 nm to about 50 nm. In one embodiment, the distance may be about 40 nm. The epi-layers 204 may be made of silicon. In one embodiment, the subsequently-formed drain regions may be doped with second-type ions. The second-type ions may be N-type ions. In some other embodiments, the epi-layers 204 may also be made of silicon phosphide. Phosphorous ions may be doped into the epi-layers 204 through an in-situ doping process. The doping concentration of the phosphorous ions may be in the range of about 1E20 atoms/cm$^3$ to about 1E22 atoms/cm$^3$. In one embodiment, the concentration of phosphorous ions may be about 1E21 atoms/cm$^3$.

The selective epitaxial deposition process may include the following fabrication parameters. The deposition temperature may be in the range of about 500 Celsius degrees to about 800 Celsius degrees. The deposition pressure may be in the range of about 1 Torr to about 100 Torr. The gas used in the deposition process may include a suitable silicon source gas, e.g., $SiH_4$ and/or $SiH_2Cl_2$. The flow rate of the silicon source gas may be in the range of about 1 sccm to about 1000 sccm. The gas used in the deposition process may also include HCl and $H_2$. The flow rate of HCl may be in the range of about 1 sccm to about 1000 sccm. The flow rate of $H_2$ may be in the range of about 0.1 sccm to about 50 sccm. In the selective epitaxial deposition process, N-type ions may be doped into the epi-layers 204 through an in-situ doping process.

For selective epitaxial deposition, because the growth rate along the <111> orientation is the lowest, the surface of an epi-layer 204 may include a plurality of facets with the <111> orientation. Further, the plurality of facets with the <111> orientation may form protruding corners on the top portion and sidewalls of an epi-layer 204.

The barrier layer 205 may be made of one or more of silicon oxide, silicon nitride, and silicon oxynitride. In one embodiment, the barrier layer 205 may include a silicon oxide layer and a silicon nitride layer on the silicon oxide layer. The thickness of the silicon nitride layer may be in the range of about 1 nm to about 3 nm, e.g., 2 nm. The barrier layer 205 may be formed through an atomic layer deposition (ALD) process. The silicon oxide layer may enhance the bonding between the silicon nitride layer and the corresponding fin 201.

The process to form the barrier layer 205 may include the following fabrication steps. First, a barrier film may be formed on the insulating layer 202, the fins 201, and the gate structure 230, as shown in FIGS. 6 and 7. The barrier film may be etched back until the top surface of a fin is exposed. The barrier layer 205 may be formed. The barrier film may form barrier sidewalls on the sidewalls of the gate structure 230.

When the epi-layers 204 are made of silicon, and the ESD protection device to be formed has a GGNMOS protection circuit structure or a gated diode protection circuit structure, the epi-layers 204 may be formed on the fins 201 in the input region 210 on one side of the gate structures 230, and on the fins 201 in the grounding region on the other side of the gate structures 230, at the same time. The epi-layers 204 may be formed by using the barrier layer 205 and the barrier sidewalls as the mask.

When the epi-layers 204 are made of silicon and the ESD protection device to be formed is an STI diode protection circuit structure, the epi-layers 204 may be formed on the fins 201 in the input region 210 and on the fins in the grounding region, at the same time.

In one embodiment, before performing the selective epitaxial deposition process, the barrier layer 205 may be used as a mask to etch the fins 201 and form an opening in a fin 201. Further, an epi-layer 204 may be formed in the opening. The etching process to form the openings may be an anisotropic dry etching process.

Figure 10:
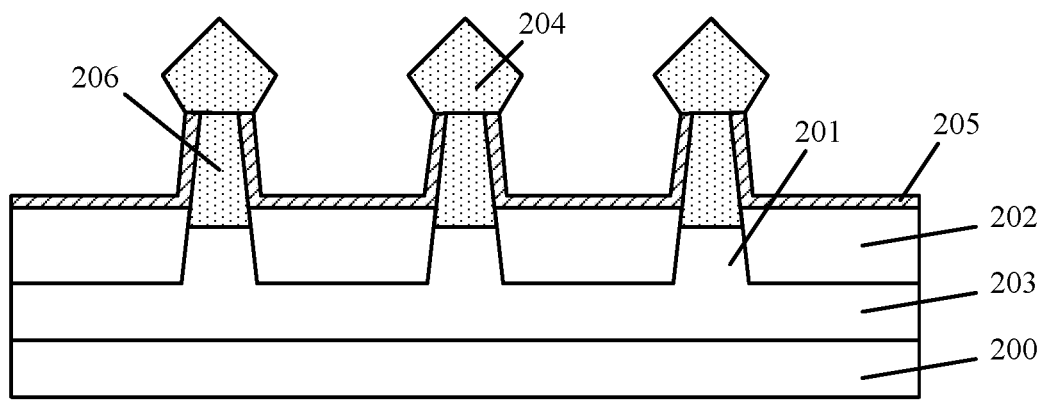

Referring to FIG. 14, after the epi-layers are formed, a drain region may be formed in the portion of the fin close to the top portion of the fin, and in the epi-layer on the fin (S1403). FIG. 10 illustrates a corresponding structure.

As shown in FIG. 10, a drain region 206 may be formed in the portion of the fin 201 close to the top portion of the fin 201, and in the corresponding epi-layer 204. Second-type ions may be doped into the drain regions 206.

The process to form the drain regions 206 may include the following fabrication steps. A first patterned layer may be formed on the barrier layer 205 and the fins 201. The first patterned layer may expose an epi-layer 204 and a portion of the corresponding fin 201 in the input region 210. The first patterned layer may be used as the mask and an ion implantation process may be performed to dope second-type ions into an epi-layer 204 and the portion of the fin 201 that is under the corresponding epi-layer 204. A drain region 206 may be formed in the fin 201 in the input region 210.

The first patterned layer may include a patterned photoresist layer. In one embodiment, the second-type ions may be N-type ions. The second-type ions may be phosphorous ions. In other embodiments, the second-type ions may also be arsenic ions. The doping concentration of the second-type ions in the drain regions may be in the range of about 1.0E14 atoms/cm$^3$ to about 5E15 atoms/cm$^3$. The bottom surface of a drain region 206 may be lower, higher, or may level with the top surface of the insulating layer 202. In one embodiment, the bottom surface of a drain region 206 may be lower than the top surface of the insulating layer 202.

When the ESD protection device to be formed has a GGNMOS protection circuit structure, the first patterned layer may also expose a portion of the epi-layers 204 and a portion of the fins 201 corresponding to the epi-layers 204 in the grounding region on one side of the gate structures 230. When ion implantation process is used to form the drain regions 206, second-type ions may also be doped into an epi-layer 204 and the portion of the corresponding fin 201 under the epi-layer 204 in the grounding region. Source regions may be formed in the epi-layers 204 and fins 201 in the grounding region.

When the ESD protection device to be formed has a GGNMOS protection circuit structure or an STI diode protection circuit, before or after the drain regions 206 are formed, the process to form the ESD protection device may further include the following fabrication steps. A second patterned layer may be formed on the barrier layer 205 and the fins 201. The second patterned layer may expose an epi-layer 204 and a portion of the corresponding fin 201 under the epi-layer 204 in the grounding region. An ion implantation process may be performed to doped first-type ions into the epi-layers 204 and corresponding fins 201 under the epi-layers 204 in the grounding region. A source region may be formed in an epi-layer 204 and the corresponding fin 201 in the grounding region.

Figure 11:
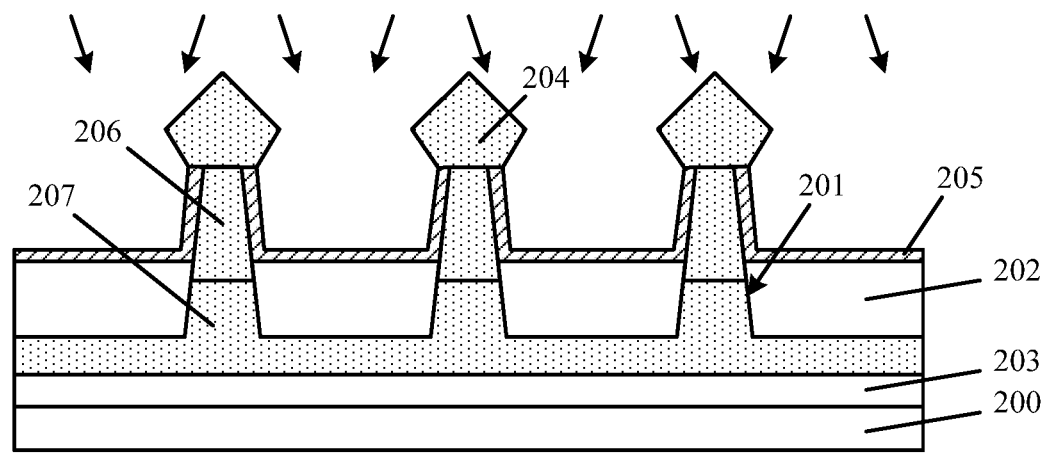

Referring to FIG. 14, after the drain regions are formed, an extended drain region may be formed in the fin and in the portion of the substrate in the input region. The extended drain region may be connected with the drain region in the same fin (S1404). FIG. 11 illustrates a corresponding structure.

As shown in FIG. 11, a first ion implantation process may be performed to form an extended drain region 207 in the fin 201 and in the portion of the substrate 200, in the input region 210. The extended drain region 207 may be connected to the drain region 206 in the same fin 201. The extended drain region 207 may be doped with second-type ions.

The first ion implantation process may be performed to form an extended drain region 207 under the drain region 206 in the same fin 201 and in the substrate 200. The type of ions doped into the extended drain regions 206 and the type of ions doped into the drain regions 206 may be the same. Thus, the connection between an extended drain region 207 and the corresponding drain 206 may enable electrical connection between the extended drain region 207 and the corresponding drain region 206. The type of ions doped into the extended drain regions 207 and the type of ion doped into the well region 203 may be opposite, so that a PN junction may form between an extended drain region 207 and the well region 203. Because the bottom of an extended drain region 207 extends in the substrate 200, the contact area between an extended drain region 207 and the substrate 200 may increase. The junction area of the PN junction may increase such that the breakdown current of the PN junction may increase. In one embodiment, the extended drain regions 207 may be connected with the bottoms of a portion of the drain regions 206. The portion of a drain region 206 that is connected to the corresponding extended drain region 207 may contact the well region 203.

The first ion implantation process may include the following fabrication parameters. The implantation energy may be in the range of about 15 KeV to about 80 KeV. The implantation dose may be in the range of about 1E13 atoms/cm$^2$ to about 3E15 atoms/cm$^2$. The angle of implantation may be in the range of about 0° to about 15°, where the angle of implantation refers to the angle between the direction of implantation and the normal line of the <200> lattice plane of the substrate 200.

In one embodiment, the angle of implantation of the first ion implantation may be greater than 0°. That is, a non-zero angle may exist between the direction of implantation and the sidewall of a fin 201 so that second-type ions may be doped into the portion of a fin 201 under the drain region 206. Second-type ions may also be doped into the portions of the substrate 200 at the bottoms of the fins 201 and between adjacent fins 201. Accordingly, the extended drain regions 207 may extend in the substrate 200.

The second-type ions, doped through the first ion implantation process, may have a considerably high dose. The implantation dose of the first ion implantation may be greater than the implantation dose of the subsequent second ion implantation. The subsequent second ion implantations may be applied to dope first-type ions. The high dose of the first ion implantation process may ensure the fins 201 may not be converted to regions of an opposite doping type.

The implantation energy of the first ion implantation process may be sufficiently high to ensure that the second-type ions can penetrate the insulating layer 202 and enter the substrate 200, such that the top surface of the formed extended drain region 207 may be lower than the top surface of the substrate 200. Further, when the implantation energy of the first ion implantation process is higher than 15 KeV, it can be ensured that the extended drain regions 207 is formed at the bottom of a drain region 206 and is connected with the drain region 206.

As shown in FIG. 12, an amorphous ion implantation may be performed on the epi-layers 204 in the input region 210 to form an amorphous layer 208 on the top surface of an epi-layer 204. The material of the amorphous layers 208 may be amorphous.

Because the amorphous layer 208 is made of an amorphous material having little atomic order, the amorphous layers 208 may block and/or buffer the subsequent second ion implantations to reduce the penetration depth of the first-type ions, doped by the second ion implantation process, into the fins 201 and the epi-layers 204. Thus, first-type ions may be doped into the portion of substrate 200 between adjacent fins 201 to form a counter-doped region. Meanwhile, the drain regions 206 and the extended drain regions 207 may not be converted to regions of an opposite doping type.

The process to form the amorphous layers 208 may include the following fabrication steps. First, a third patterned layer may be formed on the barrier layers 205 in the input regions 210 and the grounding regions. The third patterned layer may expose the epi-layers 204 in the input regions 210. Further, the third patterned layer may be used as the mask to perform the amorphous ion implantation on the epi-layers 204 in the input regions 210. The amorphous layers 208 may be formed. After the amorphous layers 208 are formed, the third patterned layer may be removed.

The thickness of an amorphous layer 208 may be in the range of about 10 Å to about 50 Å. The thickness of an amorphous layer 208 should not be overly thick to cause increased contact resistance on the surface of an epi-layer 204. The thickness of an amorphous layer 208 should not be overly thin so that the protection, provided by the epi-layer 204, to the corresponding drain region 206 in the subsequent second ion implantation process may not be compromised.

In one embodiment, the amorphous ion implantation process may implant germanium ions into the epi-layers 204. The atomic mass of a germanium ion may be sufficiently large to impair the crystal structure of the epi-layers 204 so that the amorphous layers 208 may be easy to form. The amorphous ion implantation process may include the following fabrication parameters. The implantation energy may be lower than 5 KeV. The implantation dose may be in the range of about 1E14 atoms/cm$^2$ to about 3E15 atoms/cm$^2$. The angle of implantation may be about 0°. That is, the direction of implantation may be perpendicular to the <200> lattice plane of the substrate 200.

In another embodiment, the amorphous ion implantation process may implant carbon ions into the epi-layers 204. The amorphous ion implantation process may include the following fabrication parameters. The implantation energy may be lower than 10 KeV. The implantation dose may be in the range of about 1E14 atoms/cm$^2$ to about 5E15 atoms/cm$^2$. The angle of implantation may be about 0°. That is, the direction of implantation may be perpendicular to the <200> lattice plane of the substrate 200. The atomic mass of a carbon ion may be less than the atomic mass of a germanium ion. By using carbon ions for the amorphous ion implantation process, damages to the epi-layers 204 and the inside of the fins 201 may be reduced. Particularly, damages to the contact areas between the drain regions 206 and the well region 203 may be reduced such that junction leakage current between the drain regions 206 and the well region 203 may be reduced.

Because the direction of implantation of the amorphous ion implantation process is perpendicular to the <200> lattice plane of the substrate, an amorphous layer 208, formed through the amorphous ion implantation process, may be located at the top surface of an epi-layer 204. No amorphous layer 208 may be formed on the surface of an epi-layer 204 that is facing the substrate 200, as shown in FIG. 12.

Referring to FIG. 14, after the extended drain regions are formed, a counter-doped region may be formed in the substrate between adjacent fins. The counter-doped region may insulate extended drain regions located at the bottoms of adjacent fins (S1405). FIG. 13 illustrates a corresponding structure.

As shown in FIG. 13, a second ion implantation process may be applied to form counter-doped regions 209 in the portions of the substrate 200 in the input region 210. A counter-doped region may be located between adjacent fins 201 and may insulate the extended drain regions 207, located at the bottoms of adjacent fins 201. The counter-doped regions 209 may be doped with first-type ions.

In some other embodiments, after the first ion implantation process, the second ion implantation process may be performed directly. No amorphous ion implantation process may be performed.

The second ion implantation process may be performed to form the counter-doped regions 209 in the substrate 200 in the input region. A counter-doped region 209 may be located in the substrate 200 between adjacent fins 201, and the type of ions doped into the counter-doped regions 209 may be opposite of the type of ions doped into the extended drain regions 207. After the first ion implantation process, the extended drain regions 207 in the input region 210 may be located in the portion of the substrate 200 that is at the bottom of the insulating layer 202, so that the extended drain regions 207 in adjacent fins 201 may be connected. That is, the drain regions 206 in adjacent fins 201 may be electrically connected. Thus, the counter-doped regions 209 may be desired to insulate the extended drain regions 201 in adjacent fins 201.

In one embodiment, the first-type ions may be P-type ions. The P-type ions doped into the counter-doped regions 209 may be boron ions.

The well region 203 and the counter-doped regions 209 may both be doped with P-type ions. The extended drain regions 207 may be doped with N-type ions. The well region 203 and the counter-doped regions 209 may form PN junctions with the extended drain regions 207. However, for the portion of an extended drain region 207 that extends in the substrate 200, the sidewalls of the extended drain region 207 may contact the counter-doped regions 209. The bottom of the extended drain region 207 may contact the well region 203. Thus, the contact area between the well region 203 and the counter-doped regions 209, and the contact area between an extended drain region 207 and the counter-doped regions 209 may increase. That is, the junction area of the PN junctions may increase.

An increase in the junction area of a PN junction may enable the reverse breakdown current of the PN junction to increase. Because the drain regions 206 may be connected to an electrostatic voltage, electrostatic charges may accumulate in the drain regions 206 and the extended drain regions 207. An increase in the breakdown current of a PN junction may more effectively discharge the accumulated electrostatic charges and prevent heating in the fins 201 caused by the excessive accumulation of electrostatic charges in the drain regions 206 and the extended drain regions 207. In addition, the electrostatic voltage applied on the drain regions 206 may increase. Thus, ESD protection device to be formed may have better performance and higher reliability. The ESD protection device to be formed may be able to withstand a greater range of electrostatic voltages. Thus, the ESD protection device may be used in more applications.

The second ion implantation process may include the following fabrication parameters. The implantation energy may in the range of about 5 KeV and 25 KeV. The implantation dose may be in the range of about 1E13 atoms/cm$^2$ to about 1E15 atoms/cm$^2$. The angle of implantation may be about 0°. The angle of implantation refers to the angle between the direction of implantation and the normal line of the <200> lattice plane of the substrate 200.

In one embodiment, the angle of implantation of the second ion implantation process may be about 0°. That is, the direction of implantation may be perpendicular to the surface of the substrate 200. Because the top surface of an epi-layer 204 can be protected by an amorphous layer 208, the penetration depths of the second-type ions into the epi-layer 204 and the corresponding fin 201 may be reduced. Further, because the implantation dose of the second ion implantation process may be lower than the implantation dose of the first ion implantation process, the first-type ions doped into the epi-layers 204 and the fins 201 may be recombined. Thus, no counter-doped regions may be formed in the drain regions 206 and the extended drain regions 207.

Between adjacent fins 201, because the direction of implantation is perpendicular to the surface of the substrate 200, the first-type ions may penetrate the insulating layer 202 and enter the substrate 200. Further, the implantation energy may be sufficiently high such that the first-type ions may be desirably concentrated in the substrate 200. A portion of an extended drain region 207 between adjacent fins 201 may be converted to a counter-doped region 209.

Thus, extended drain regions 207 at the bottoms of adjacent fins 201 may be insulated from each other.

In summary, in the embodiments of the present disclosure, by forming the extended drain regions that extend from the fins into the substrate by the first ion implantation process, the top surfaces of the extended drain regions may be lower than the top surface of the substrate. By forming the counter-doped regions in the substrate between adjacent fins by the second ion implantation process, adjacent extended drain regions, extending from adjacent fins into the substrate, may be insulated from each other. The counter-doped regions and the well region may be doped with first-type ions. The drain regions and the extended drain regions may be doped with second-type ions. Thus, a PN junction may be formed between an extended drain region and the well region, and between an extended drain region and counter-doped regions. For the portion of an extended drain region in the substrate, the bottom of such portion may be in contact with the well region, and the sidewalls of such portion may be in contact with the counter-doped regions, so that the junction area of the PN junctions may be sufficiently large. Breakdown current may be effectively increased and less or little electrostatic charges may accumulate in the drain regions. The disclosed ESD protection device may increase the efficiency to discharge electrostatic charges, and may prevent heating in the fins caused by accumulation of electrostatic charges. Semiconductor devices applying the disclosed ESD protection device may be less susceptible to damages, and the service time of the semiconductor devices may be improved.

Accordingly, embodiments of the present disclosure provide an ESD protection device formed by the disclosed method. As shown in FIG. 13, the disclosed ESD protection device may include a substrate 200. The substrate 200 may include input regions 210. A plurality of fins 201 may be formed on the input region 210. An insulating layer 202 may be formed on the substrate 200. The insulating layer 202 may cover a portion of the sidewall of a fin 201. The top surface of the insulating layer 202 may be lower than the top surface of a fin 201. The ESD protection device may also include a well region 203 formed in the substrate 200 and in the fins 201. The well region 203 may be doped with first-type ions. The ESD protection device may further include an epi-layer 204 on the top surface of a fin 201 in the input region 210. The ESD protection device may further include a drain region 206 in the portion of a fin 201 that is close to the top portion of the fin 201. The drain region 206 may also be formed in the epi-layer 204. The drain regions 206 may be doped with second-type ions. The ESD protection device may further include extended drain regions 207. An extended drain region 207 may be formed in a fin 201 and in the substrate 200. An extended drain region 207 may be connected with a drain region 206 in the same fin 201. The extended drain regions 207 may be doped with second-type ions. The ESD protection device may further include counter-doped regions 209 in the portions of the substrate 200 that are in input regions 201. A counter-doped region 209 may be formed between adjacent fins 201 and insulate adjacent extended drain regions 207. The counter-doped regions 209 may be doped with first-type ions.

The structure of the disclosed ESD protection device is now described in detail in connection with the drawings.

Drains regions formed in the input region 210 may be connected to an electrostatic voltage. In one embodiment, the substrate 200 may also include grounding regions. Fins 201 may be formed on the surface of the substrate 200 in the grounding region. Source regions may subsequently be formed in the grounding region to discharge the electrostatic charges flown into the source regions.

The number of fins 201 in the input region 210 may be equal to or greater than 1. The number of fins 201 in a grounding region may be equal to or greater than 1. In one embodiment, in an input region 210, a plurality of fins 201 may be arranged in parallel; and in a grounding region, a plurality of fins 201 may be arranged in parallel.

The insulating layer 202 may insulate adjacent fins 201. The insulating layer 202 may be made of one or more of silicon oxide, silicon nitride, a low-K dielectric material (i.e., with dielectric constant equal to or greater than 2.5 and less than 3.9), and an ultra-low-K dielectric material (i.e., with dielectric constant less than 2.5). In one embodiment, the insulating layer 202 may be made of silicon oxide. The thickness of the insulating layer 202 may be in the range of about 50 nm to about 80 nm, e.g., about 60 nm.

The first-type ions in the well region 203 may be P-type ions. In one embodiment, the ions doped into the well region 203 may be boron ions.

In one embodiment, as shown in FIGS. 5 and 6, FIG. 5 may be the cross-section view of the structure shown in FIG. 6 along the AA' direction. The first portion of a fin 201 in the input region 210 may be connected with the second portion of the fin 201 in a grounding region 221. A gate structure 230 may be formed on the fin portions between the input region 210 and the grounding region 221. The gate structure 230 may cross a plurality of fins 201 along a direction the fins 201 are aligned. The gate structure 230 may be formed on a portion of the sidewall and on the top surface of fins 201.

The gate structure 230 may ground the disclosed ESD protection device. Lightly-doped regions may be formed in the fins 201 on both sides of the gate structure 230. The lightly-doped regions may be doped with second-type ions. In one embodiment, the lightly-doped regions may be doped with N-type ions. The N-type ions may be phosphorus ions and/or arsenic ions.

Source regions may be formed in the fins 201 in the grounding regions 221, and the source regions may be doped with first-type ions. In one embodiment, the ESD protection device to be formed may have a gated diode protection circuit structure. Further, when the source regions are doped with the first-type ions, the grounding regions 221 may be located on both sides of an input region 210.

In another embodiment, as shown in FIGS. 5 and 7, FIG. 5 may be a cross-sectional view of the ESD structure shown in FIG. 7 along the BB' direction. The first portion of a fin 201 in the input region 210 may be connected with the second portion of the fin 201 in the grounding region 222. A gate structure 230 may be formed on the fin portion between the input region 210 and the grounding region 221. The gate structure 230 may cross a plurality of fins 201 along a direction the fins 201 are aligned. The gate structure 230 may be formed on a portion of the sidewall and on the top surface of fins 201.

Source regions may be formed in the fins 201 in the grounding regions 222. The source regions may be doped with second-type ions. In one embodiment, the ESD protection device to be formed may have a GGNMOS protection circuit structure.

In another embodiment, as shown in FIGS. 5 and 8, FIG. 5 may be a cross-sectional view of the structure shown in FIG. 8 along the CC' direction. The fins 201 in the input regions 210 may be separated from the fins 201 in the grounding regions 223. Subsequently, source regions may be formed in the fins 201 in the grounding regions 223. The source regions may be doped with first-type ions. The grounding regions 223 may be located on both sides of an input region 210. In one embodiment, the ESD protection device to be formed may have an STI diode circuit structure.

The epi-layers 204 may be made of silicon. The surface of an epi-layer 204 may include a plurality of facets with the <111> orientation. Further, the plurality of facets with the <111> orientation may form protruding corners on the top portion and sidewalls of an epi-layer 204.

In one embodiment, the drain regions may be doped with second-type ions. The second-type ions may be N-type ions. In some other embodiments, the epi-layers 204 may also be made of silicon phosphide. Phosphorous ions may be doped into the epi-layers 204 through an in-situ doping process. The doping concentration of the phosphorous ions may be in the range of about 1E20 atoms/cm$^3$ to about 1E22 atoms/cm$^3$. In one embodiment, the concentration of phosphorous ions may be about 1E21 atoms/cm$^3$ In one embodiment, the second-type ions may be N-type ions. The second-type ions may be phosphorous ions. In other embodiments, the second-type ions may also be arsenic ions. The doping concentration of the second-type ions in the drain regions may be in the range of about 1.0E14 atoms/cm$^3$ to about 5E15 atoms/cm$^3$. The bottom surface of a drain region 206 may be lower, higher, or may level with the top surface of the insulating layer 202. In one embodiment, the bottom surface of a drain region 206 may be lower than the top surface of the insulating layer 202.

The doping concentration of the second-type ions in the extended drain regions 207 may be in the range of about 1E13 atoms/cm$^3$ to about 3E15 atoms/cm$^3$. The type of ions doped into the extended drain regions 207 and the type of ion doped into the well region 203 may be opposite, so that a PN junction may form between an extended drain region 207 and the well region 203. Because the bottom of an extended drain region 207 extends in the substrate 200, the contact area between an extended drain region 207 and the substrate 200 may increase. The junction area of the PN junction may increase such that the breakdown current of the PN junction may increase.

In one embodiment, an amorphous layer 208 may be formed on the top surface of an epi-layer 204. The material of the amorphous layers 208 may be amorphous. The thickness of an amorphous layer 208 may be in the range of about 10 Å to about 50 Å. In some other embodiments, no amorphous layer 208 may be formed on the top surface of an epi-layer 204.

In one embodiment, the first-type ions may be P-type ions. The P-type ions doped into the counter-doped regions 209 may be boron ions. The doping concentration of the first-type ions in the counter-doped regions 209 may be in the range of about 1E13 atoms/cm$^3$ to about 1E15 atoms/cm$^3$.

The well region 203 and the counter-doped regions 209 may both be doped with P-type ions. The extended drain regions 207 may be doped with N-type ions. The well region 203 and the counter-doped regions 209 may form PN junctions with the extended drain regions 207. Further, for the portion of an extended drain region 207 that extends in the substrate 200, the sidewalls of the extended drain region 207 may contact the counter-doped regions 209. The bottom of the extended drain region 207 may contact the well region 203. Thus, the contact area between the well region 203 and the counter-doped regions 209, and the contact area between an extended drain region 207 and the counter-doped regions 209 may increase. That is, the junction area of the PN junctions may increase.

Compared to a conventional ESD protection device, the fabrication method provided in the current disclosure has the following advantages.

By forming the extended drain regions that extend from the fins into the substrate by the first ion implantation process, the top surfaces of the extended drain regions may be lower than the top surface of the substrate. By forming the counter-doped regions in the substrate between adjacent fins by the second ion implantation process, adjacent extended drain regions, extending from adjacent fins into the substrate, may be insulated from each other. The counter-doped regions and the well region may be doped with first-type ions. The drain regions and the extended drain regions may be doped with second-type ions. Thus, a PN junction may be formed between an extended drain region and the well region, and between an extended drain region and counter-doped regions. For the portion of an extended drain region in the substrate, the bottom of such portion may be in contact with the well region, and the sidewalls of such portion may be in contact with the counter-doped regions, so that the junction area of the PN junctions may be sufficiently large. Breakdown current may be effectively increased and less or little electrostatic charges may accumulate in the drain regions. The disclosed ESD protection device may increase the efficiency to discharge electrostatic charges, and may prevent heating in the fins caused by accumulation of electrostatic charges. Semiconductor devices applying the disclosed ESD protection device may be less susceptible to damages, and the service time of the semiconductor devices may be improved.

Further, in the disclosed ESD protection device, the extended drain regions may extend from the fins into the substrate such that the bottom of an extended drain region may be below the top surface of the substrate. The counter-doped regions may be located in the substrate between adjacent fins. A counter-doped region may insulate adjacent extended drain regions, which extend from adjacent fins to the substrate. The counter-doped regions and the well regions may be doped with first-type ions. The drain regions and the extended drain regions may be doped with second-type ions. Thus, an extended drain region may form a PN junction with a well and a counter-doped region, respectively. For the some of the extended drain regions in the substrate, the bottoms of which may contact the well regions and the sidewalls of which may contact counter-doped regions, the junction area of a PN junction formed by an extended drain region and the well/counter-doped region may be sufficiently large, so that the breakdown current of the PN junction may be effectively increased/improved. Little or no electric charges may accumulate in the drain regions. The disclosed ESD structure may more efficiently discharge electrostatic charges, and may prevent heating problems in the fins caused by the accumulation of electric charges. The disclosed ESD structure may prevent semiconductor devices from being damaged and the service time of the semiconductor devices may be improved.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. An electrostatic discharge (ESD) protection device, comprising:
 a substrate having an input region;
 a plurality of fins on the substrate in the input region;

a well region, doped with first-type ions, in the plurality of fins and in the substrate;

an epitaxial layer on each fin in the input region;

a drain region, doped with second-type ions, in a top portion of each fin and in the epitaxial layer;

an extended drain region, doped with the second-type ions, in a bottom portion of each fin to connect to the drain region and in a portion of the substrate, in the input region; and a counter-doped region, doped with the first-type ions, in a portion of the substrate between two adjacent fins to insulate adjacent extended drain regions, wherein a PN junction is formed between the counter-doped region and the extended drain region.

2. The device according to claim 1, further comprising an insulating layer formed on the substrate, the insulating layer covering a portion of a sidewall of a fin, a top surface of the insulating layer being lower than the top surfaces of the plurality of fins.

3. The device according to claim 2, further comprising at least two grounding regions for grounding the ESD protection device, a plurality of fins being formed on the substrate in the grounding region.

4. The device according to claim 3, wherein a first portion of a fin in the input region is connected to a second portion of the fin in the grounding region through a fin portion, and a gate structure is formed on a plurality of fin portions between the input region and the grounding region, the gate structure covering a top surface and a portion of a sidewall of fin portions.

5. The device according to claim 4, further comprising a source region formed in each fin in a grounding region and the source regions is doped with first-type ions or second-type ions.

6. The device according to claim 5, wherein when the source region is doped with the first-type ions, one grounding region is located at one of two sides of the input region.

7. The device according to claim 2, wherein fins in the input region are separated from fins in a grounding region.

8. The device according to claim 7, further comprising a source region formed in each fin in a grounding region.

9. The device according to claim 8, wherein when the source region is doped with the first-type ions, one grounding region is located at one of two sides of the input region.

10. The device according to claim 3, further comprising: an amorphous layer formed on the epitaxial layer, the amorphous layer being made of an amorphous material.

11. The device according to claim 10, wherein germanium ions are implanted into the epitaxial layer to form amorphous layer.

12. The device according to claim 1, wherein the first-type ions are P-type ions and the second-type ions are N-type ions.

13. The device according to claim 12, wherein the first-type ions are boron ions and the second-type ions are phosphorous ions.

14. The device according to claim 1, wherein the epitaxial layer is made of one or more of silicon and silicon phosphide.

15. An electrostatic discharge (ESD) protection device, comprising:

a substrate including an input region;

a plurality of fins on the substrate in the input region;

an insulating layer on the substrate, the insulating layer covering a portion of a sidewall of a fin, a top surface of the insulating layer being lower than the top surfaces of the plurality of fins;

a well region, doped with first-type ions, in the plurality of fins and in the substrate;

an epitaxial layer on each fin in the input region;

a drain region, doped with second-type ions, in a top portion of each fin and in the epitaxial layer;

an extended drain region, doped with the second-type ions, in a bottom portion of each fin to connect to the drain region and in a portion of the substrate, in the input region; and a counter-doped region, doped with the first-type ions, in a portion of the substrate between two adjacent fins to insulate adjacent extended drain regions, wherein the counter-doped region is formed on the well region and in a surface portion of the substrate between two adjacent fins to insulate adjacent extended drain regions.

* * * * *